United States Patent [19]
Cho

[11] Patent Number: 5,561,674
[45] Date of Patent: Oct. 1, 1996

[54] SYNCHRONOUS COUNTER AND METHOD FOR PROPAGATION CARRY OF THE SAME

[75] Inventor: Il-Jae Cho, Yongin-gun, Rep. of Korea

[73] Assignee: Samsung Electronics Co., Ltd., Suwon, Rep. of Korea

[21] Appl. No.: 449,780

[22] Filed: May 24, 1995

[30] Foreign Application Priority Data

May 26, 1994 [KR] Rep. of Korea ................. 11485/1994

[51] Int. Cl.$^6$ .................................................. H03K 21/02
[52] U.S. Cl. .............. 377/55; 377/56; 377/111; 377/114
[58] Field of Search .................. 377/55–6, 111, 377/114

[56] References Cited

U.S. PATENT DOCUMENTS

| | | | |
|---|---|---|---|
| 5,150,390 | 9/1992 | Hayashi et al. | 377/116 |
| 5,309,494 | 5/1994 | Grehl | 377/56 |
| 5,483,566 | 7/1992 | O'Hara, Jr. et al. | 377/55 |

*Primary Examiner*—Margaret Rose Wambach
*Attorney, Agent, or Firm*—William L. Geary, Jr.

[57] ABSTRACT

A synchronous counter performing a count operation in response to an input of a clock having a fixed frequency. The synchronous counter including a first transmission gate receiving a counter initialization signal and transferring the counter output signal to a carry output node when the counter initialization signal is received during a time period in which the external address signal is not received, and a second transmission gate receiving the counter initialization signal and transferring an address signal to the carry output node when said counter initialization signal is received during a time period in which the external address signal is received.

4 Claims, 7 Drawing Sheets

SYNCHRONOUS COUNTER AND METHOD FOR PROPAGATION CARRY OF THE SAME

BACKGROUND OF THE INVENTION

The present invention relates to a synchronous counter counting cycles of an input clock having a fixed period. More particularly, the present invention relates to a synchronous counter capable of reducing carry propagation delay in a multi-stage counter. The present invention also relates to a method of reducing carry propagating delay for a synchronous counter used in a multi-stage counter.

The synchronous counter is a well known circuit element. Conventional synchronous counters perform up or down count operations using a plurality of flip-flops which respond to a clock having a fixed period. Synchronous counters are generally used in a variety of integrated circuits, but are particularly important components in semiconductor memory devices which access stored data according to an incrementing or decrementing address signal.

In other applications, a first synchronous counter, typically having a simple structure, within a first circuit stage provides an output signal to a subsequent circuit stage in response to transitions in a synchronous clock. In such applications, the stability and efficiency of conventional counters is improved by using the carry signal generated by the first synchronous counter in the first circuit stage as the output signal to the subsequent circuit stage. Unfortunately, the individual and/or cumulative delay required for each "carry ripple" between adjacent circuit stages leads to unacceptable transition speed.

This problem has previously been addressed in U.S. Pat. Nos. 3,943,478 and 4,679,216 which disclose a synchronous counter employing a method wherein a unit counter accumulatively gates output signals from one or more first circuit stages, and thereafter uses the gated signals as input signals to one or more subsequent circuit stages. The input portion of a NAND gate used in the gating operation of the foregoing synchronous counter is complicated. Yet, the NAND gate must also be very small physically depending on the number of stages in the counter. This conflict results in problems with the integration of the overall device.

Thus, it has proved difficult to address the problem of slow transition speed for the carry signal between adjacent circuit stages. Transition speed is an important operational parameter for synchronous counters responding to a synchronous clock. In particular, transition speed deficiencies in a synchronous counter used in semiconductor memory device, such as a DRAM, lead to malfunction of the overall memory device, and/or reduction in the reliability of the counter addressing operation.

Figure 1:
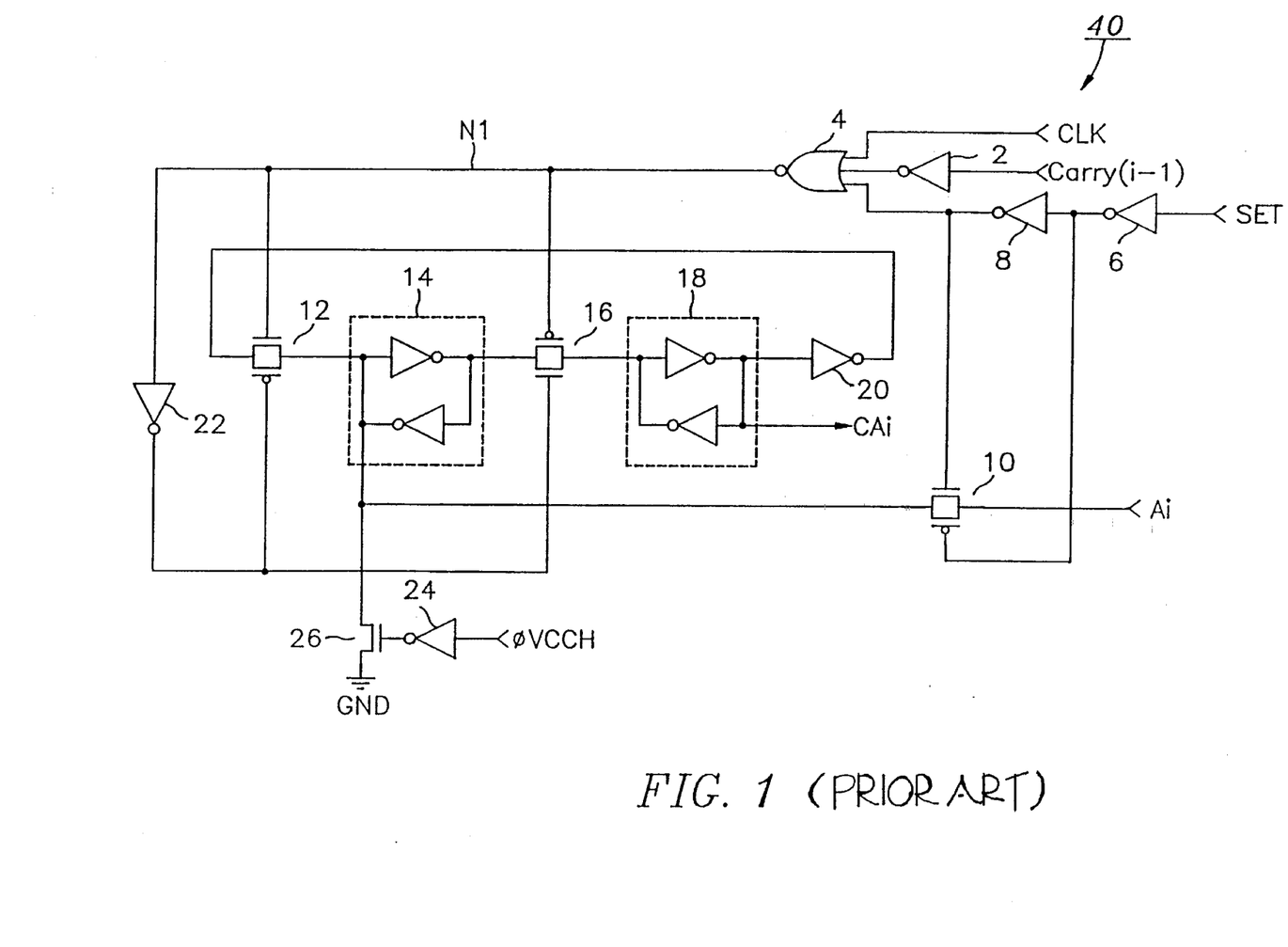
FIG. 1 is a circuit diagram showing a conventional synchronous counter.
Figure 2:
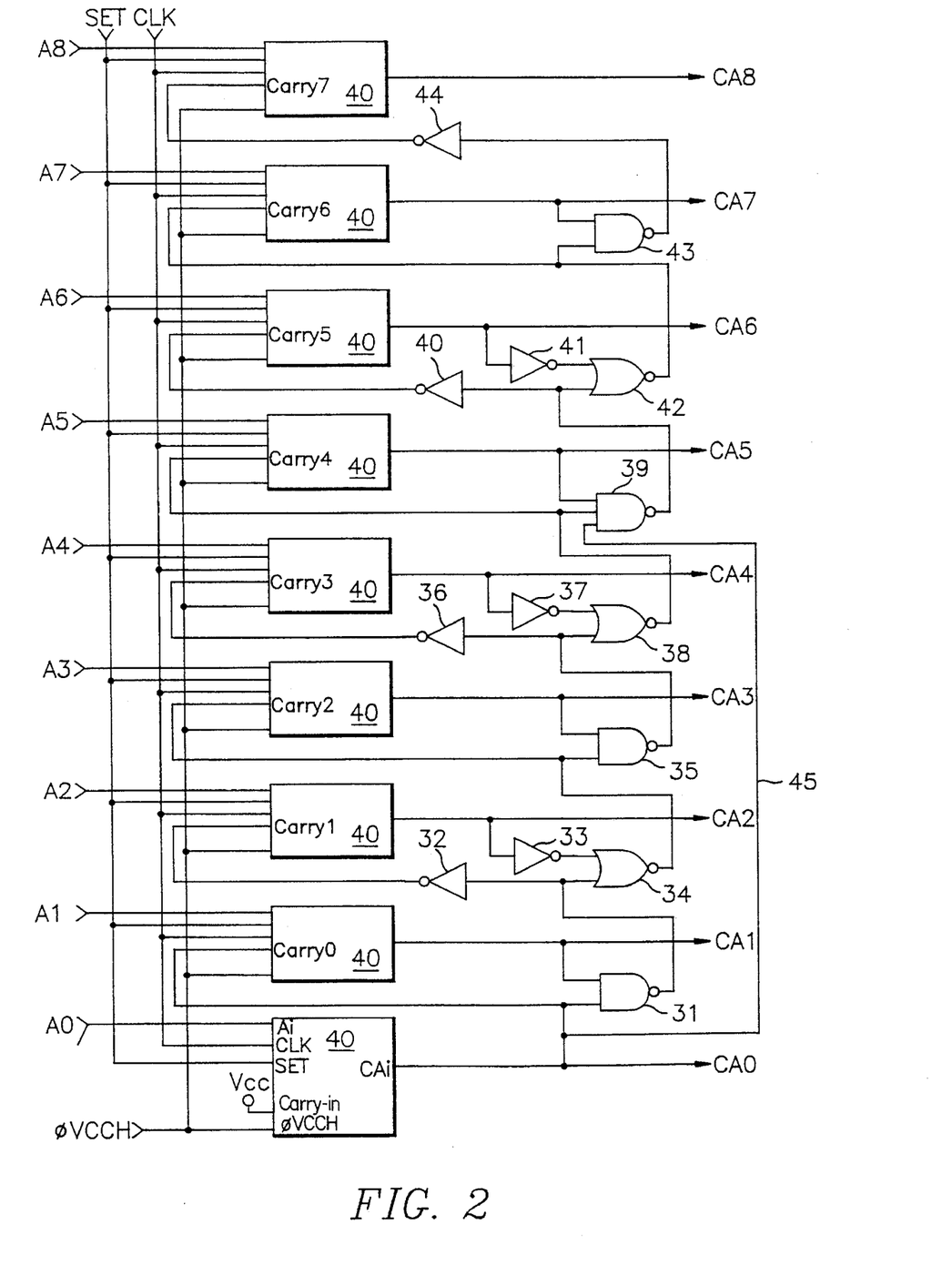
FIG. 2 is a circuit diagram showing a conventional synchronous multi-stage counter incorporating a plurality of counters shown in FIG. 1.
Figure 3:
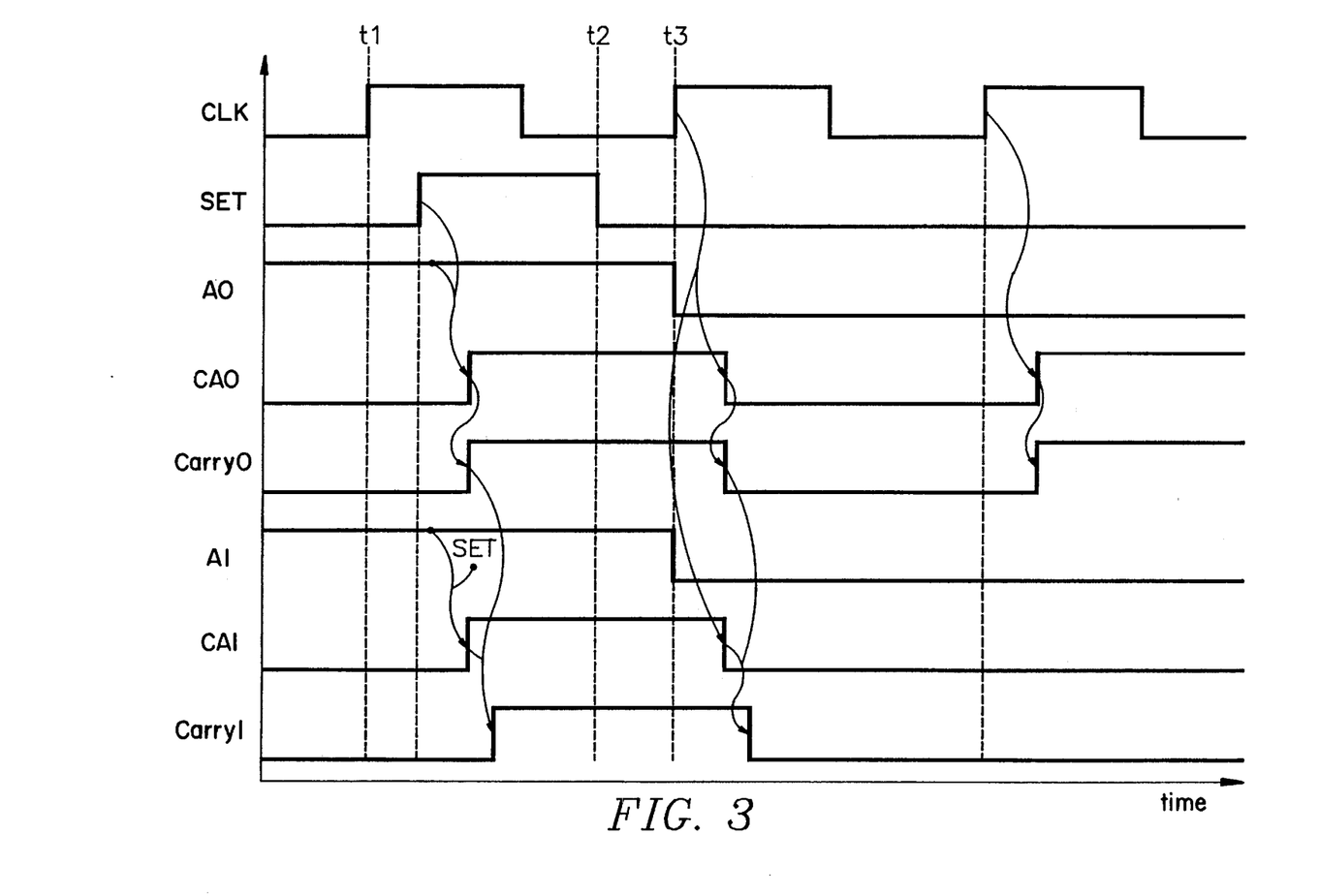
FIG. 3 is a group of operational timing diagrams for the circuit shown in FIGS. 1 and 2.

A conventional counter is disclosed in Korean Patent Application No. 93-23598 entitled "A Synchronous Binary Counter" on Nov. 8, 1993. FIG. 1 shows a unit counter disclosed in the above patent application. FIG. 2 shows a multi-stage counter configured with a plurality of unit counters like the one shown in FIG. 1. FIG. 3 is a timing diagram for the conventional synchronous counter shown in FIG. 1.

In the conventional synchronous counter of FIG. 1, CLK is used as a reference indicator for a master clock signal. SET is an external signal used to designate an initial address for the counter. Ai is an interior address signal received from a buffer to which external address signals are applied. CAi is a counter output signal. "Carry i" indicates a carry signal from the conventional counter at a time i.

The operation of the conventional synchronous counter will be described hereinafter with reference to FIGS. 1 and 3. A typical operation cycle begins with SET changing from a logical "low" to "high" during the period in which CLK is high. The high SET signal is inverted by an inverter 6, again inverted by inverter 8, and these signals are respectively applied to transmission gate 10. See FIG. 3 between t1 and t2. As a result, transmission gate 10 is turned ON and a first latch circuit 14, controlled by ground isolation transistor 26 and control signal $\phi$VCCH inverted by inverter 24, latches inverted address signal Ai. Further, the output of a NOR gate 4, node N1, is low because of the high clock signal CLK and the double inverted, high signal SET. The signal at node N1 is inverted by inverter 22. If node N1 becomes low, a transmission gate 12 is turned OFF, and a transmission gate 16 is turned ON. Thus, the output of first latch circuit 14 is applied to a second latch circuit 18 through transmission gate 16. Second latch circuit 18 latches the inverted output of first latch circuit 14 and generates signal CAi as an output.

In case where CLK and SET are low and a Carry (i-1) is high, the operation of the synchronous counter is as follows. When SET becomes low, transmission gate 10 is turned OFF and the input path of address signal Ai is closed. Since the high Carry (i-1) is applied to NOR gate 4 through inverter 2, all three inputs to NOR gate 4 are low, thus, making node N1 high. Transmission gate 12 is turned ON, and transmission gate 16 is turned OFF. Accordingly, first latch circuit 14 latches the inverted signal CAi output from an inverter 20 and input to first latch circuit 14 through transmission gate 12. At this time, first and second latch circuits 14 and 18 are isolated by the transmission gate 16.

Referring to time t3 in FIG. 3, if CLK again changes to high, node N1 again becomes low. Accordingly, transmission gate 12 is turned OFF and transmission gate 16 is turned ON. Second latch circuit 18 reversely latches CAi latched during the time interval between times t2 and t3 by the output of the first latch circuit 14. At time t3, CAi output by second latch circuit 18 is input to a carry generating logic gate in a subsequent circuit stage.

Referring now to FIG. 2, after NANDing CA0 and CA1, a carry 1 is generated by inverting the output of a NAND gate 31 with inverter 32. A carry 2 is generated by NORing CA2, inverted with inverter 33, and carry 1 in NOR gate 34. Further, after NANDing CA3 and carry 2 in a NAND gate 35, a carry 3 is generated by inverting the an output of NAND gate 35 with an inverter 36. In the same manner as the above, the other carry signals are generated in illustrated stages. In the case of an odd carry K, a carry CA(K) and a carry (K-1) are applied to a NAND gate and an inverter. In the case of an even carry L, the inverted values of a carry CA(L) and a carry (L-1) are applied to a NOR gate. In this manner, the carry propagation is performed by the logic gates of FIG. 2. Additionally in FIG. 2, a three-input NAND gate 39 receives signal line 45 to rapidly setting a carry 5 to low when the carry becomes low.

This configuration allows a normal count operation to be performed in the most significant bit counter with sufficient speed to allow system clock operation in a high frequency range of 150 MHz. However, where the address signal is set in the counter according to an external signal and the output signal generated in the counter is propagated to the carry generating logic gate after setting the interior of the counter, the carry generating time is delayed by the interval required to set the interior of the counter with the exterior address signal. As a result, conventional counters can not operate at frequencies sufficient to support evolving semiconductor applications.

SUMMARY OF THE INVENTION

The present invention provides a synchronous counter and a carry propagation method operable in semiconductor devices having higher system clock frequencies. The present invention also provides a synchronous counter and a carry propagation method which reduces carry propagation delay. The present invention further provides a synchronous counter and a carry propagation method capable of generating carry, regardless of the internal "setting" operation performed in the counter in response to an external address input.

A synchronous counter according to the present invention comprises first and second switching devices. The first switching device provides a counter initialization signal and transfers the counter output signal to a carry output node when the counter initialization signal is input during an inactive state. The second switching device provides the counter initialization signal and transfers an address signal to the carry output node when the counter initialization signal is input during an active state.

BRIEF DESCRIPTION OF THE DRAWINGS

The above and other advantages and features of the present invention will be more apparent from the following detailed description taken with the attached drawings in which.

Within the foregoing Figures, like reference numerals and signal designations indicate like elements and input/output signals.

DETAILED DESCRIPTION OF THE PREFERRED EMBODIMENT

Figure 4:
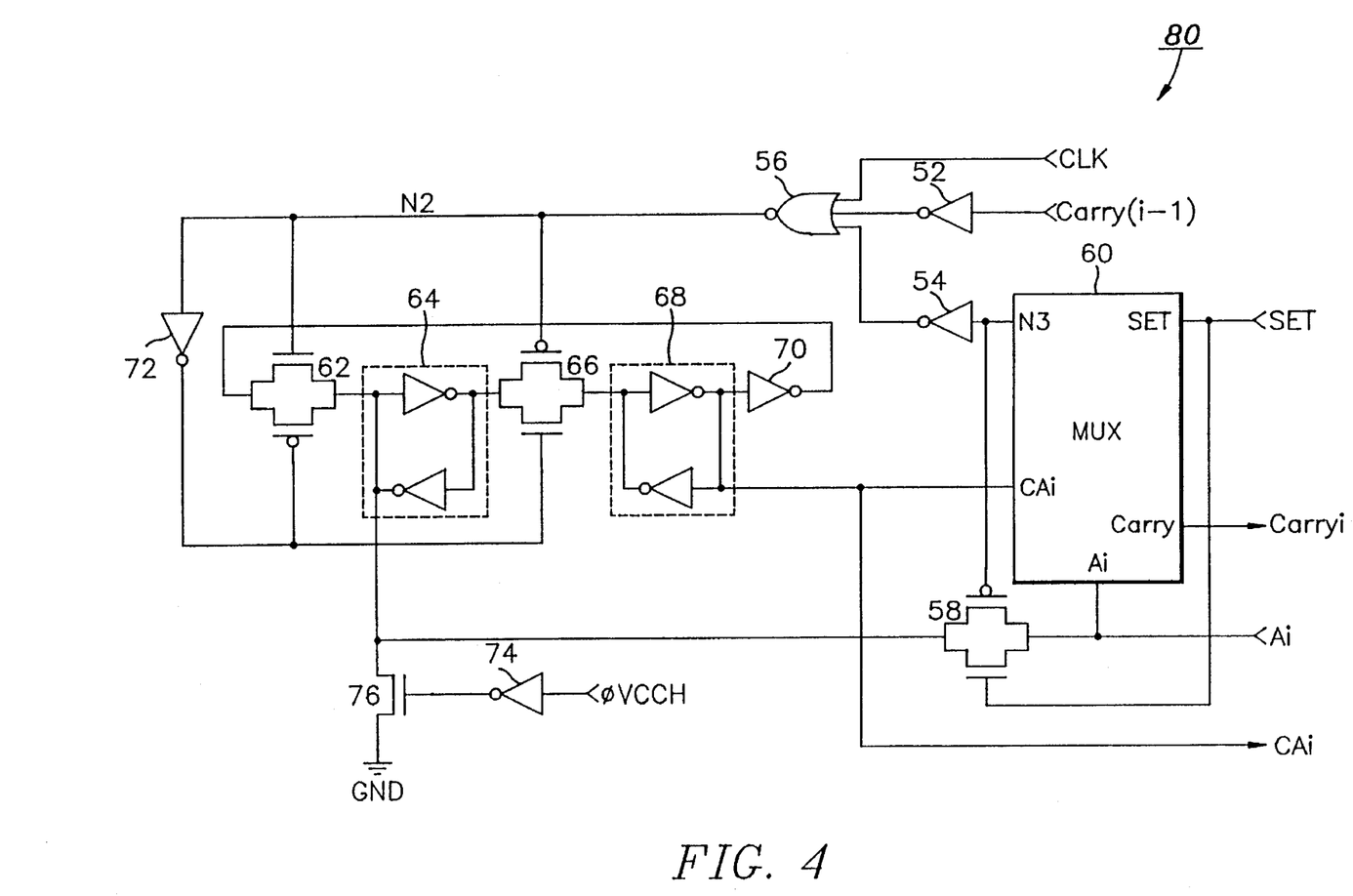
FIG. 4 is a circuit diagram of an embodiment of a counter according to the present invention.

FIG. 4 is a circuit diagram showing an embodiment of a counter according to the present invention. The synchronous counter of the present invention includes a multiplexer. This configuration allows an external address signal to directly propagate the carry without passing through the interior of the counter during setting the external address signal, and thus, high frequency operation is performed by improving the carry propagation time.

FIG. 4 a multiplexer 60 arranged within the input/output signal paths of the signals discussed with reference to FIG. 1. In particular, multiplexer 60 receives the SET signal, address signal Ai, and counter output signal CAi.

Figure 5:
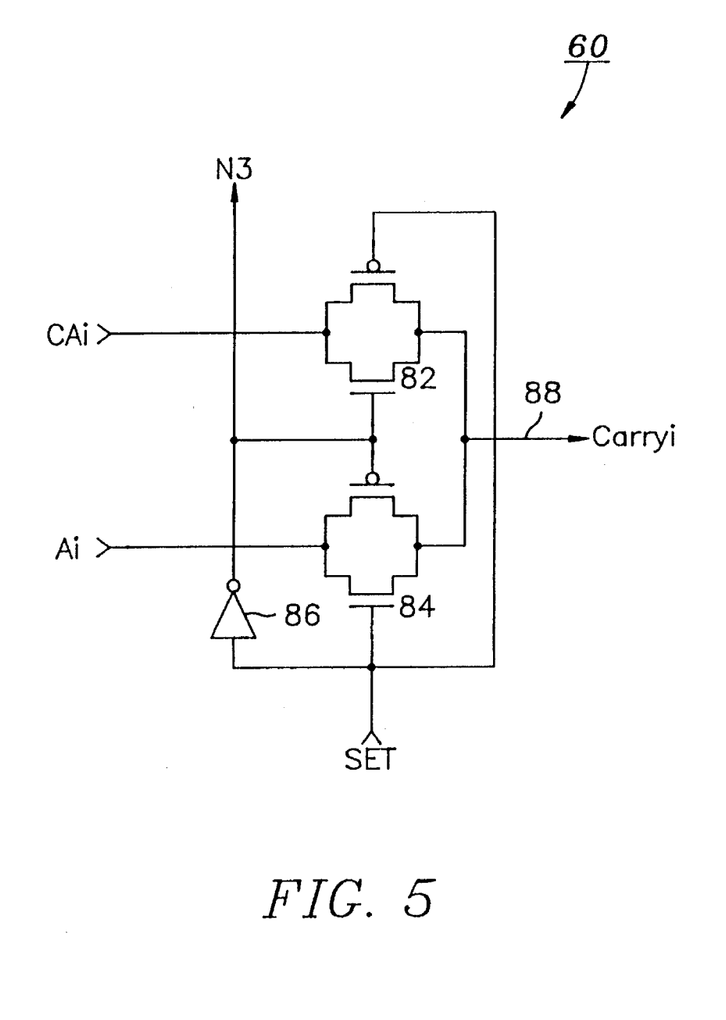
FIG. 5 is a circuit diagram of an embodiment of the multiplexer shown in FIG. 4.

A presently preferred embodiment of multiplexer 60 is shown in greater detail on FIG. 5. Multiplexer 60 comprises transmission gates 82 and 84. In response to the SET signal as applied through inverter 86, transmission gate 82 transfers the counter output signal CAi to an output node 88 during a counter inactive state. Also in response to the SET signal, inverter transmission 84 transfers the address signal Ai to output node 88 during a counter active state. The alternate signals applied to node 88 are output as Carry i. Thus, transmission gates 82 and 84 are operated to selectively output signals CAi and Ai in response to the changing input of the SET signal.

Figure 6:
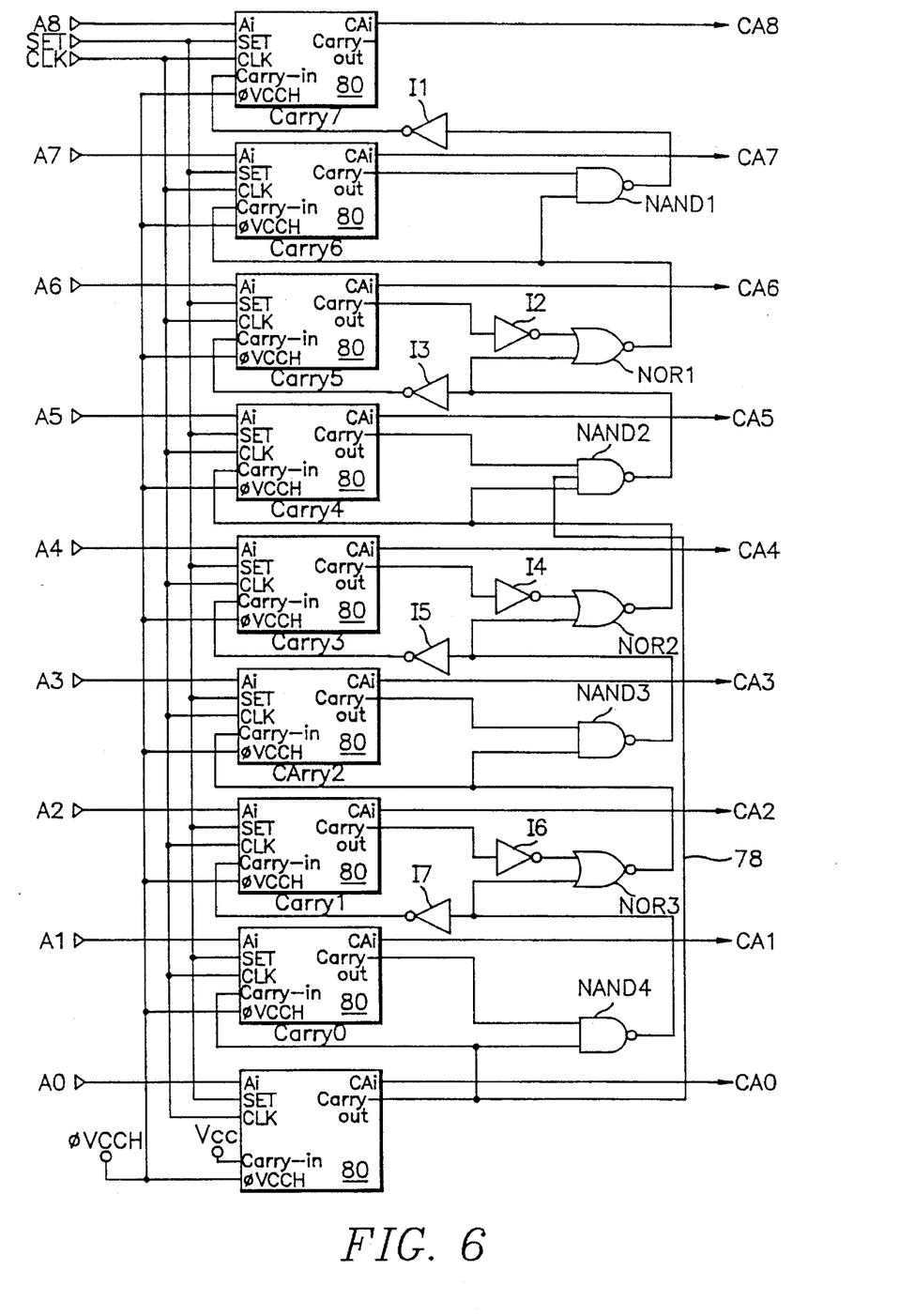
FIG. 6 is a circuit diagram of an embodiment of a multi-stage synchronous counter incorporating a plurality of counters constructed according to the embodiment shown in FIG. 4.

FIG. 6 is the circuit diagram showing an embodiment of a multi-stage synchronous counter incorporating a plurality of counters 80 configured in accordance with the circuit of FIG. 4. The construction of FIG. 6 will be explained with respect to the operational discussion below.

Figure 7:
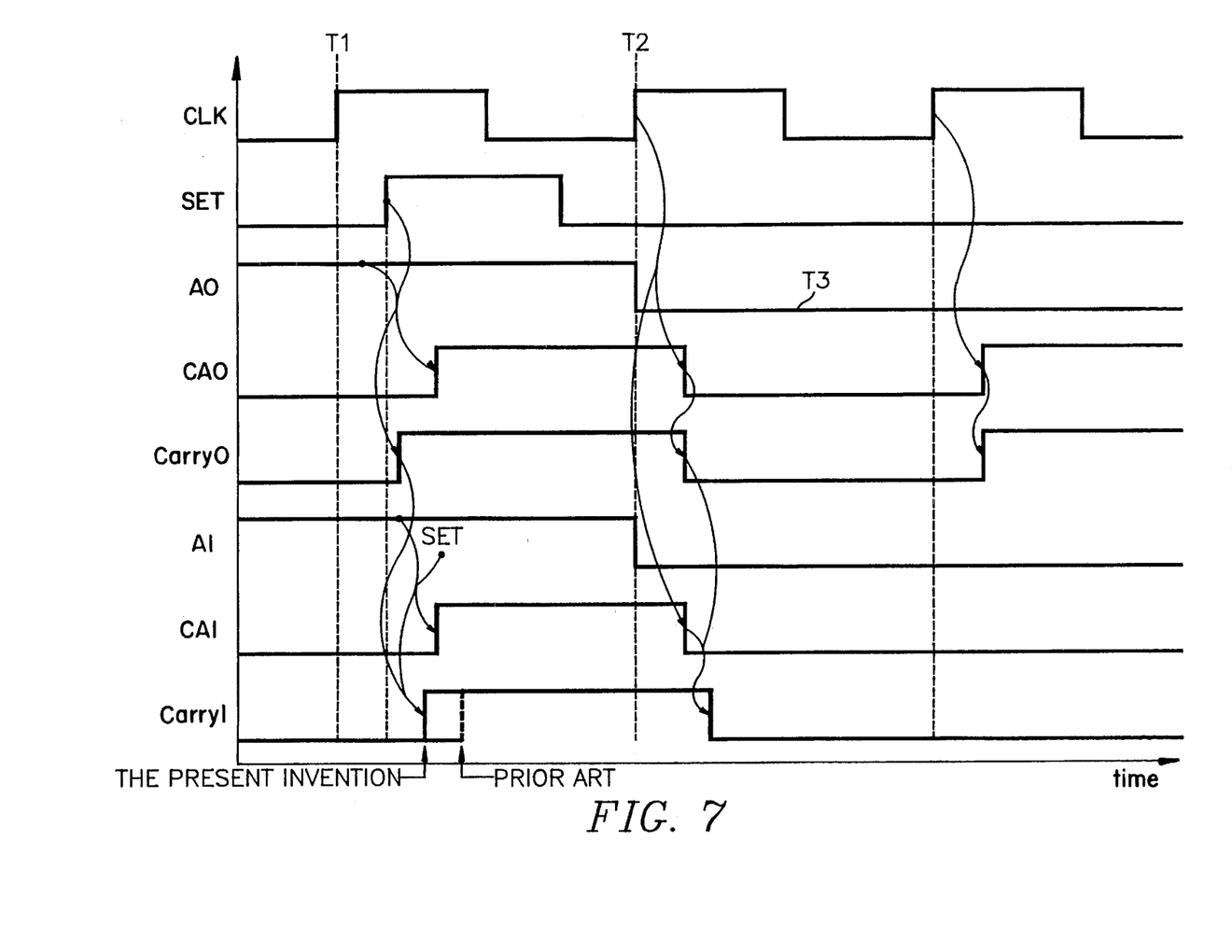
FIG. 7 is a group of operational timing diagrams for the circuit shown in FIGS. 4 and 6.

FIG. 7 is a group of operational timing diagrams for the circuit shown in FIGS. 4 and 6. This group of timing diagrams illustrates the temporal relationship between input/output and internal counter signals. In FIG. 7, Carry 0 is output from the synchronous counter receiving the A0 address signal, or least significant bit. Carry 1 is output from the synchronous counter receiving the A1 address signal. FIG. 7 also illustrates the improvement in Carry signal propagation over the prior art with respect to Carry 1, as an example. The improved carry signal propagation efficiency of the present invention is obtained by comparing time that, following enablement of the signal SET, Carry 1 goes high in relation to the time that Carry 0 went high.

With respect to FIGS. 4, 5, and 6 and the timing diagram of FIG. 7, the operation of the synchronous counter 80 will be explained. The input signals of FIGS. 4 through 7 are conventional. As explained above, SET, Ai, and CAi are applied to multiplexer 80. Ai is also applied to transmission gate 58. CLK is applied to NOR gate 56. Carry(i-1) and an output signal from multiplexer 60, N3 are also applied to NOR gate 56, but through inverters 52 and 54, respectively. $\phi$VCCH is applied to control transistor 76, which is placed between first latch circuit 64 and ground, through inverter 74.

When SET becomes high in response to receiving an external address signal A0 at time t1 in FIG. 7, transmission gate 84 within multiplexer 60, shown in FIG. 5, is turned ON, and transmission gate 82 is turned OFF. As a result, external address signal A0 is directly propagated to node 88 as Carry 0 through the channel of transmission gate 84. The signal CA0 shown in FIG. 7 lags SET, but goes high following the transition of SET from low to high. Also at this time, node N2, the output of NOR gate 56, becomes low. Accordingly, transmission gate 62 is turned OFF and transmission gate 66 is turned ON, so that address signal A0 passes through transmission gate 58 and is latched in first and second latch circuits 64 and 68.

Further, when, at time t3 in FIG. 7, SET becomes low during the interval when the external address signal is not applied, transmission gates 84 and 82 are turned OFF and turned ON, respectively. Under these conditions, counter operation is equally performed as in conventional counter. As discussed above, the external address signals directly propagate the carry through multiplexer 60 without passing through the interior of the counter during the setting of the external address signal.

Within the multi-stage counter shown in FIG. 6, each counter 80 receives an external address signal in the manner described above with respect to A0. Respective address signals are then applied to the carry generating logic gate, indicated with inverters I1 through I7, NAND gates NAND1 through NAND4, and NOR gates NOR1 through NOR3, through the respective transmission gates 84 of the respective multiplexers 60 as shown in FIG. 5. Carry 0 is applied to NAND2 via signal line 78, as previously explained. This configuration markedly reduces propagation delay as compared with the conventional multistage counter.

According to the foregoing apparatus and method, it is possible to solve the problem of carry propagation delay in a synchronous counter receiving an external address signal. As mentioned above, the synchronous counter of the present invention performs carry propagation at the high speed through a multiplexer when the external address signal is applied. The foregoing embodiment is given by way of example. The present invention is defined by the appended claims.

What is claimed is:

1. A counter operable in synchronization with a system clock and receiving an external address signal, comprising:

a first transmission gate receiving a counter initialization signal and transferring the counter output signal to a carry output node when the counter initialization signal is received during a time period in which the external address signal is not received; and a second transmission gate receiving the counter initialization signal and transferring an address signal to the carry output node when said counter initialization signal is received during a time period in which the external address signal is received.

2. The counter of claim 1, wherein the first and second transmission gates are configured in a multiplexer receiving the counter initialization signal and the external address signal.

3. A synchronous counter, comprising:

a counter receiving at least a clock signal, a counter initialization signal, and an external address signal, said counter providing a counter output signal; and a multiplexer receiving at least said external address signal, said counter initialization signal, and said counter output signal, said multiplexer providing an output of either said external address signal or said counter output signal in response to said counter initialization signal.

4. A synchronous counter according to claim 3, wherein said multiplexer further comprises:

a first transfer gate and a second transfer gate, each said transfer gate having an input, an output, and at least one control input, said transfer gates having their outputs connected together;

said first transfer gate having its input connected to said counter output signal;

said second transfer gate having its input connected to said external address signal; and said counter initialization signal connected via an inverter to said control input of said first transfer gate and connected to said control input of said second transfer gate, wherein said counter initialization signal selects either said first transfer gate or said second transfer gate.

* * * * *